United States Patent [19]

Kiemle et al.

[11] Patent Number: 4,686,142
[45] Date of Patent: Aug. 11, 1987

[54] PROCESS FOR THE PRODUCTION OF IRON OXIDES EPITAXIALLY COATED WITH COBALT THE COATED OXIDES AND THEIR CUE

[75] Inventors: Peter Kiemle, Krefeld-Traar; Jürgen Wiese, Krefeld; Gunter Buxbaum, Krefeld-Traar, all of Fed. Rep. of Germany

[73] Assignee: Bayer Aktiengesellschaft, Leverkusen, Fed. Rep. of Germany

[21] Appl. No.: 652,214

[22] Filed: Sep. 20, 1984

Related U.S. Application Data

[63] Continuation of Ser. No. 517,792, Jul. 27, 1983, abandoned.

[30] Foreign Application Priority Data

Jul. 31, 1982 [DE] Fed. Rep. of Germany ....... 3228659

[51] Int. Cl.⁴ ............................................. H01F 10/02
[52] U.S. Cl. .................................... 428/403; 427/127; 427/129; 427/132; 428/469; 428/694; 428/900
[58] Field of Search ................................ 427/127–132; 428/900, 403, 694, 695, 469; 346/1.1

[56] References Cited

FOREIGN PATENT DOCUMENTS 3017652 11/1980 Fed. Rep. of Germany ...... 427/132
55-132005 10/1980 Japan ................................... 427/127

Primary Examiner—Bernard D. Pianalto
Attorney, Agent, or Firm—Connolly & Hutz

[57] ABSTRACT

In improved cobalt coated magnetic iron oxide having increased coercive field strength and highly efficient for use in magnetic recording devices and processes is produced by subjecting uncoated magnetic iron oxide particles to an acid treatment and then epitaxially coating the treated particles with cobalt.

11 Claims, 1 Drawing Figure

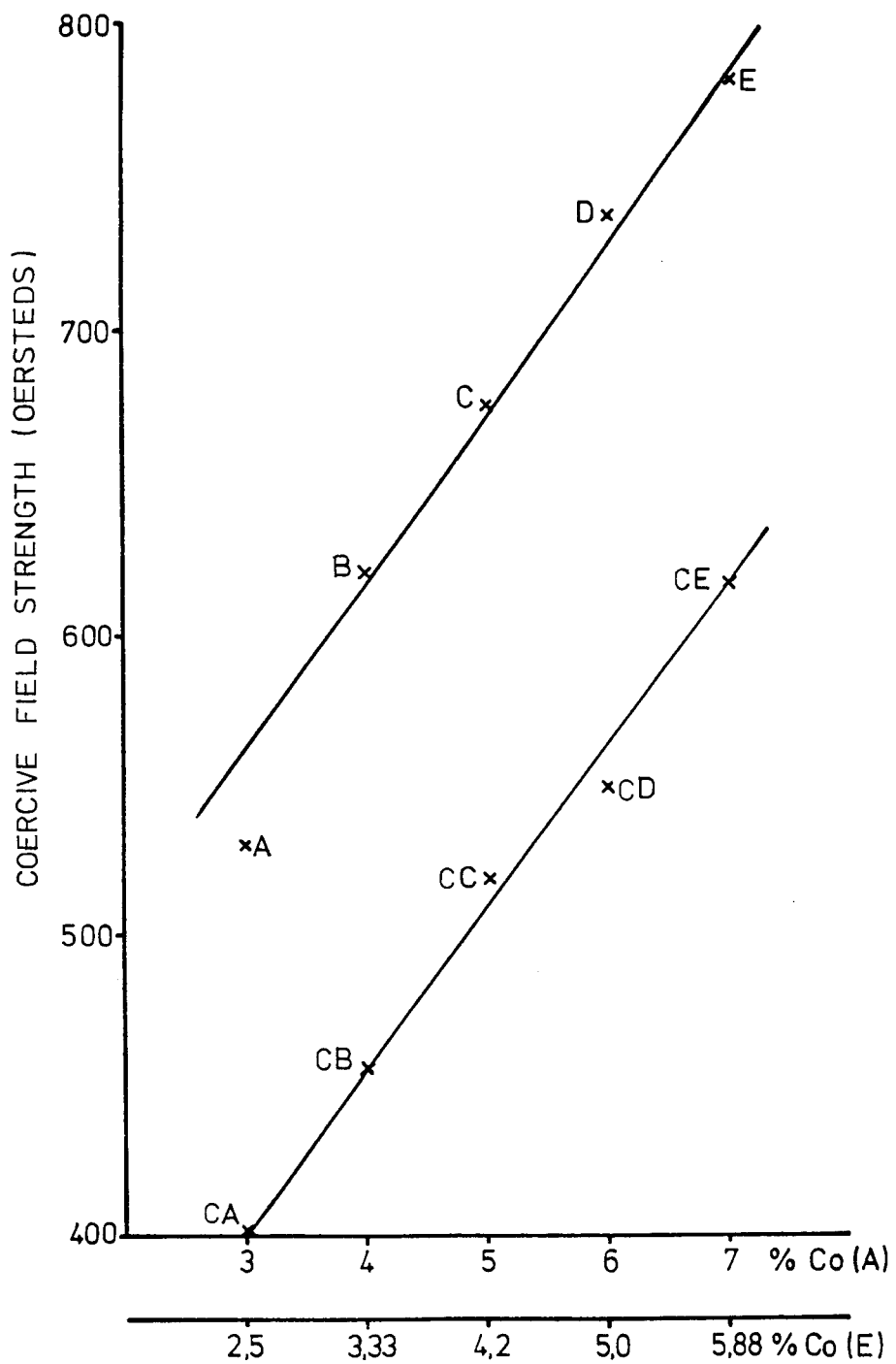

PROCESS FOR THE PRODUCTION OF IRON OXIDES EPITAXIALLY COATED WITH COBALT THE COATED OXIDES AND THEIR CUE

This application is a continuation of application Ser. No. 517,792 filed July 27, 1983 now abandoned.

This invention relates to a process for the production of magnetic iron oxides epitaxially coated with cobalt and characterized by increased coercive force.

Known $\gamma$-$Fe_2O_3$ magnetic pigments and $Fe_3O_4$ magnetic pigments have coercive forces of up to about 380 Oersteds (Oe) and 410 Oe, respectively. There is an increasing demand for magnetic pigments having considerably higher coercive field strengths for use in magnetic signal recording in the audio, video and data storage fields.

BACKGROUND OF THE INVENTION

There are various known processes for increasing the coercive field strength of magnetic iron oxides.

According to U.S. Pat. No. 4,297,395, pigments showing increased coercive field strength are obtained from $\alpha$-FeOOH precursor compounds which have been doped with cobalt. A coercive field strength of around 620 Oe is obtained with 1.0% of cobalt for an FeO-content of 20%. However, these pigments have the disadvantages of low copying attenuation and inadequate magnetic stability.

Another method of obtaining high coercive field strengths is described in U.S. Pat. No. 4,122,216. In this process, a layer of cobalt ferrite is crystallized epitaxially onto a core of magnetic iron oxide in a strongly alkaline medium. Compared with the cobalt doped pigments, these pigments show considerably better copying attenuation values and greater magnetic stability. One disadvantage of these pigments however, lies in the fact that large quantities of the very expensive element, cobalt, are required for obtaining the desired coercive field strength.

GB-PS No. 2.060.592 describes a process in which the magnetic iron oxide is dispersed in water in a mildly alkaline medium. Cobalt is then deposited onto its surface. The cobalt-coated iron oxides thus obtained have a higher coercive field strength than products which are dispersed in water having a mildly acidic pH-value (pH 4.2). However, the increase obtainable in coercive field strength and the possible saving of cobalt are minimal.

Accordingly, the object of the present invention is to provide magnetic iron oxide pigments having increased coercive field strength which are not attended by any of the above-mentioned disadvantages for equivalent cobalt contents.

SUMMARY OF THE INVENTION

It has now surprisingly been found that these advantages are afforded by an acid treatment of magnetic iron oxides prior to epitaxially coating.

BRIEF DESCRIPTION OF THE DRAWING

The FIGURE illustrates a plot of coercive field strength (oersteds) vs. percent cobalt for untreated magnetic particles (lower line) and for magnetic particles produced by the claimed process (upper line).

The present invention provides a process for the production of magnetic iron oxides epitaxially coated with cobalt and characterized by increased coercive field strength. Specifically, the process improves prior art processes by the magnetic iron oxides to be coated being subjected to an acid treatment before coating.

The acid treatment may be carried out advantageously on $\gamma$-$Fe_2O_3$, $Fe_3O_4$ or bertholoid compounds having an FeO-content of from 0 to 30%.

These iron oxides may contain one or more accompanying elements selected from P, Zn, B, Si, Sn, Ge, Al, Mn, Cr and Ni.

Particularly good results are obtained when the accompanying elements are zinc and/or phosphorus.

Prior to applying a cobalt coating, the magnetic iron oxide to be coated is preferably treated with an acid or mixtures of acids which form complexes with the iron oxide. Examples of such complex-forming acids are hydrochloric acid and oxalic acid. The iron oxide can be conveniently treated with the acid in a solution with water being a preferred solvent for the acid. However, it is to be understood that other solvents may also be suitably employed. The acid concentration of such solution is preferably adjusted to between 0.3 and 3 normal and the iron oxide is treated with the acid at temperatures of from 10° to 90° C. for as long as the weight loss occurring during the acid treatment does not exceed 30% and is preferably between 5 and 20%. The magnetic iron oxide is filtered, washed and then epitaxially coated with cobalt ferrite.

Coating with cobalt ferrite may be carried out by the process described in U.S. Pat. No. 4,122,216. However, other epitaxial coating processes may also be used without any disadvantages.

The dependence of the coercive field strength upon the quantity of cobalt used is graphically illustrated in the accompanying FIGURE in which the upper curve (points A to E) represents the iron oxides treated in accordance with the invention while the lower curve (points CA to CE) represents a material which has not been subjected to an acid treatment. The material used to receive the acid treatment and coating was standard commercial $\gamma$-$Fe_2O_3$-magnetic pigment (Bayferrox ® 8220 M, a product of Bayer AG). The percentages are based in each case on the weight of the substances; % Co (A) is the quantity of cobalt based on the product to be coated and % Co (E) is the quantity of cobalt, based on the end product.

The improvement obtained by the process according to the invention can clearly be seen by comparing the two curves in the FIGURE.

Hitherto, approximately 7% of cobalt (based on the starting material used and corresponding to 5.88% of cobalt in the end product) has been required for obtaining a coercive field strength of 620 Oe required for application in high-quality grade II audio tapes or for video recording tapes (½ inch). Using the process according to the invention, this quantity of cobalt may be reduced by more than 40%.

The fact that the process according to the invention leads to these results may be regarded as all the more surprising insofar as acid treatments of $\gamma$-$Fe_2O_3$ do not produce any increase in the coercive field strength without a subsequently applied coating of cobalt ferrite (U.S. Pat. No. 4,280,918).

Accordingly, the present invention also relates to magnetic iron oxides epitaxially coated with cobalt obtained by the described process and to their use for magnetic signal recording. Thus the present invention also provides new and improved devices (for example, audio and video recording tapes) for recording magnetic signals wherein a plurality of magnetic particles produced by this invention are oriented in a support media so that the particles can be magnetically oriented in response to electrical impulses. This invention also provides an improved magnetic recording method wherein the improved recording devices are employed. The pigments according to the invention are also suitable for use as a starting material for the production of high quality metal pigments.

The invention is illustrated but in no way limited by the following Examples in which the percentages quoted represent percentages by weight.

EXAMPLE 1

480 g of magnetic $\gamma$-$Fe_2O_3$-pigment (Bayferrox ® 8220 M, a product of BAYER AG; average particle length 0.4 $\mu$m, coercive field strength 345 Oe) are suspended in 2400 ml of water in a Kotthoff mixing siren, subsequently wet-ground in a colloid mill, heated with stirring to 50° C. and 491 ml of concentrated hydrochloric acid (corresponding to 163 g of HCl) are added. After stirring for 15 minuts, the solid is filtered off and washed until free from acid.

Cobalt ferrite coating: the solid treated with hydrochloric acid is suspended a quantity of water such that a solids content of 150 g/l is obtained. The quantities of $FeSO_4.7H_2O$, $CoSO_4.7H_2O$ and NaOH indicated in Table I are successively added to the suspension. Before the addition, the NaOH is dissolved in a quantity of water such that a final solids concentration of 120 g/l is obtained.

TABLE I

| Test | % Co, based on the quantity of $\gamma$-$Fe_2O_3$ | $FeSO_4.7H_2O$ (g) | $CoSO_4.7H_2O$ (g) | NaOH (g) |
|---|---|---|---|---|
| A | 3 | 133.4 | 68.16 | 349.76 |
| B | 4 | 179.7 | 91.13 | 465.28 |
| C | 5 | 224.32 | 113.6 | 581.76 |
| D | 6 | 269.6 | 136.32 | 697.6 |
| E | 7 | 314.24 | 159.04 | 814.4 |

The suspension is heated with stirring to 80° C. and kept at that temperature for 6 hours. The solid is then filtered, washed and dried at 30° C. in a recirculating air drying cabinet.

EXAMPLE 2 (Comparison Example) 480 g of magnetic $\gamma$-$Fe_2O_3$-pigment (same as in Example 1) are suspended in 2400 ml of water using a Kothoff mixing siren and subsequently wet-ground in a colloid mill. The solid is filtered and coated with cobalt ferrite as described in Example 1 (tests CA to CE).

The following Table II lists the coercive strengths observed for the production of Example 1 and comparison Example 2.

TABLE II

| Example 1 | Coercive field strength $I_HC$ (Oe) | Example 2 | Coercive field strength $I_HC$ (Oe) |
|---|---|---|---|
| A | 529 | CA | 402 |
| B | 620 | CB | 458 |
| C | 675 | CC | 518 |
| D | 736 | CD | 548 |
| E | 779 | CE | 617 |

We claim:
1. A process for the production of magnetic iron oxides epitaxially coated with cobalt and having increased coercive field strength, comprising subjecting the magnetic iron oxides to be coated to an acid treatment before coating, said acid treatment resulting in a weight loss of iron oxides of from 2 to 30%, and then epitaxially coating the acid treated oxides with cobalt.
2. A process as claimed in claim 1, characterized in that the iron oxides to be coated are $\gamma$-$Fe_2O_3$, $Fe_3O_4$ or a bertholoid compound having an FeO-content of from 0 to 30%.
3. A process as claimed in claim 2, characterized in that the magnetic iron oxides to be coated contain one or more accompanying elements selected from the group consisting of P, Zn, B, Si, Sn, Ge, Al, Mn, Cr and Ni.
4. A process as claimed in claim 3, characterized in that the accompanying elements are Zn and/or P.
5. A process as claimed in claim 1, characterized in that the acids contain acid residues which form complexes with iron.
6. A process as claimed in claim 5, characterized in that the acid residues are chloride and/or oxalate.
7. A process as claimed in claim 6 characterized in that the acid concentration is in the range from 0.3 to 3N and the acid treatment is carried out at a temperature in the range from 10° to 90° C.
8. A process as claimed in claim 5, characterized in that the acid concentration is in the range from 0.3 to 3N and the acid treatment is carried out at a temperature in the range from 10° to 90° C.
9. Magnetic iron oxides epitaxially coated with cobalt obtained by the process claimed in claim 1.
10. The use of the magnetic iron oxides epitaxially coated with cobalt claimed in claim 1 for magnetic signal recording.
11. A process as claimed in claim 1, characterized in that the acid treatment is carried out up to a weight loss of iron oxide to be coated of from 5 to 20%, based on the weight of the iron oxide to be coated.

* * * * *